United States Patent [19]

Ahmad et al.

[11] Patent Number: 5,208,176
[45] Date of Patent: May 4, 1993

[54] METHOD OF FABRICATING AN ENHANCED DYNAMIC RANDOM ACCESS MEMORY (DRAM) CELL CAPACITOR USING MULTIPLE POLYSILICON TEXTURIZATION

[75] Inventors: Aftab Ahmad; Pierre C. Fazan; Ruojia Lee, all of Boise, Id.

[73] Assignee: Micron Technology, Inc., Boise, Id.

[21] Appl. No.: 603,528

[22] Filed: Oct. 25, 1990

Related U.S. Application Data

[63] Continuation-in-part of Ser. No. 465,692, Jan. 16, 1990, and a continuation-in-part of Ser. No. 465,693, Jan. 16, 1990.

[51] Int. Cl.$^5$ .................... H01L 21/00; H01L 21/02; H01L 21/70
[52] U.S. Cl. ........................ 437/47; 437/51; 437/52; 437/233; 257/499; 257/528
[58] Field of Search ............ 437/47, 51, 52, 233; 357/40

[56] References Cited

U.S. PATENT DOCUMENTS

| | | | |
|---|---|---|---|
| 460,453 | 1/1890 | Fazan et al. | |
| 4,300,212 | 11/1981 | Simko | 365/185 |
| 4,676,867 | 6/1987 | Elkins et al. | 156/643 |
| 4,676,868 | 6/1987 | Riley et al. | 156/643 |
| 4,894,696 | 1/1990 | Takeda et al. | 437/984 |
| 5,043,780 | 8/1991 | Fagan et al. | 357/23.6 |
| 5,068,199 | 11/1991 | Sandhu | 437/47 |
| 5,112,773 | 5/1992 | Tuttle | 437/233 |

FOREIGN PATENT DOCUMENTS

| | | |
|---|---|---|
| 0069589 | 3/1977 | Japan . |
| 56-94655 | 7/1981 | Japan . |
| 0061063 | 9/1984 | Japan . |
| 0152051 | 6/1985 | Japan . |
| 61-225872 | 10/1986 | Japan . |
| 665918A5 | 6/1988 | Switzerland . |

OTHER PUBLICATIONS

Sakao, A Capacitor Over Bit-Line (COB) Cell with a Hemispherical-Grain Storage Node for 64MbDRAMS, International Electronic Device Meeting (IEDM), Dec. 1990, pp. 655-657.

(List continued on next page.)

*Primary Examiner*—Brian E. Hearn
*Assistant Examiner*—B. Everhart
*Attorney, Agent, or Firm*—Limbach & Limbach

[57] ABSTRACT

A DRAM cell having a doped monocrystalline silicon substrate for the cell's lower capacitor plate whose surface has been texturized multiple times to enhance cell capacitance. After texturization, a thin silicon nitride layer is deposited on top of the texturized substrate, followed by the deposition of a poly layer, which functions as the cell's upper, or field, capacitor plate. The nitride layer, conformal and thin compared to the surface texture of the mono substrate, transfers the texture of the substrate to the cell plate layer. The effective capacitor plate area is substantially augmented, resulting in a cell capacitance increase of at least approximately fifty percent compared to a conventional planar cell utilizing identical wafer area. The substrate is texturized by texturizing a thin polycrystalline silicon (poly) starter layer that has been deposited on top of the substrate by using an anisotropic etch or wet oxidation step, and then allowing the poly starter layer to be consumed, transferring the texture created on the poly starter layer to the underlying substrate. By subjecting the starter layer to either an etch or an oxidation step, atoms at the grain boundaries of the starter layer react more rapidly, thus establishing the texturization pattern. Once established, the starter layer's texturization pattern is transferred to the monocrystalline silicon surface by either etching or oxidizing the starter layer. Performing this texturization process multiple times produces greater texturization due to the consumption of the successive poly starter layers along their respective, uniquely superimposed grain boundaries.

12 Claims, 11 Drawing Sheets

OTHER PUBLICATIONS

Yoshimaru, Rugged Surface Poly-Si Electrode and Low Temperature Deposited $Si_3N_4$ for 65 Mb and Beyond STC DRAM Cell, International Electronic Device Meeting (IEDM), Dec. 1990, pp. 659–661.

Fazan, Thin Nitride Films on Textured Polysilicon to Increase Multimegabit DRAM Cell Charge Capacity, IEEE Electron Device Letters, vol. 11, No. 7, Jul. 1990, pp. 279–281.

T. Mine, S. Iijima, J. Yugami, K. Ohga & T. Morimoto, "Capacitance-Enhanced Stacked-Capacitor with Engraved Storage Electrode for Deep Submicron DRAMs", 21st Conference on Solid State Devices and Materials, Tokyo, 1989, pp. 137–140.

M. Olcer, H. J. Buhlmann, & M. Illegems, "Enhanced Current Injection in Thermal Oxides Grown on Texturized Silicon", Journal of the Electrochemical Society, vol. 133, No. 3, Mar. 1986, pp. 621–627.

Y. Fong, A. T. Wu, R, Moazzami, P. K. Ko, & C. Hu, "Oxides Grown on Textured Single-Crystal Silicon for Low Programming Voltage Non-Volatile Memory Applications", Proceedings of 1987 I.E.D.M., pp. 87-899 through 87-891.

T. Ema, S. Kawanago, T. Nishi, S. Yoshida, H. Nishibe, T. Yabu, Y. Kodama, T. Nakano & M. Taguchi, "3-Dimensional Stacked Capacitor Cell for 16M and 64M DRAMS", Proceedings of 1988, I.E.D.M., pp. 88-592 through 88-595.

S. Inoue, K. Hieda, A. Nitayama, F. Horiguchi & F. Masuoka, "A Spread Stacked Capacitor (SSC) Cell for 64MBIT DRAMs", Proceedings of 1989, I.E.D.M., pp. 89-31 through 89-34.

METHOD OF FABRICATING AN ENHANCED DYNAMIC RANDOM ACCESS MEMORY (DRAM) CELL CAPACITOR USING MULTIPLE POLYSILICON TEXTURIZATION

RELATED APPLICATIONS

This case is a continuation-in-part of patent applications having Ser. Nos. 07/465,692 and 07/465,693, both filed on Jan. 16, 1990.

BACKGROUND OF THE INVENTION

1. Field of the Invention

This invention relates to semiconductor technology and, more specifically, to the design of capacitors used in dynamic random access memory (DRAM) cells. The focus of the invention is upon processes for imparting a texturized surface to a doped monocrystalline silicon substrate that is used for a planar DRAM cell's lower capacitor plate in order to increase the capacitance of the cell.

2. Description of the Related Art

The memory cells of dynamic random access memories are comprised of two main components: a field-effect transistor and a capacitor. In DRAM cells utilizing a conventional planar capacitor (such as the one depicted in FIG. 1), far more chip surface area is dedicated to planar capacitor 11 than to field-effect transistor (FET) 12. The gate 13 of FET 12 and the word line 14 are formed from an etched polycrystalline silicon-1 layer. Bit line 15 connects with access-node junction 16. Capacitor 11 has a lower (storage-node) plate formed from the n+ silicon substrate extension 17 of storage-node junction 18 of FET 12. Upper capacitor plate (or field plate) 19 is formed from a layer of conductively-doped polycrystalline silicon. Substrate extension 17 is electrically insulated from upper plate 19 by a dielectric layer 20.

Planar capacitors have generally proven adequate for use in DRAM chips up to the one-megabit level. However, planar capacitors constructed with conventional dielectric materials appear to be unusable beyond the one-megabit DRAM level. As component density in memory chips has increased, the shrinkage of cell capacitor size has resulted in a number of problems.

Firstly, the alpha-particle component of normal background radiation will generate hole-electron pairs in the n+ silicon substrate plate of a cell capacitor. This phenomena will cause the charge within the affected cell capacitor to rapidly dissipate, resulting in a "soft" error. Secondly, as cell capacitance is reduced, the sense-amp differential signal is reduced. This aggravates noise sensitivity and makes it more difficult to design a sense-amp having appropriate signal selectivity. Thirdly, as cell capacitance is decreased, the cell refresh time must generally be shortened, thus requiring more frequent interruptions for refresh overhead.

The difficult goal of a DRAM designer is therefore to increase or, at least, maintain cell capacitance as cell size shrinks, without resorting to processes that reduce product yield or that markedly increase the number of masking and deposition steps in the production process. Several methods for providing adequate cell capacitance in the face of shrinking cell size are either in use or under investigation. Basically, the efforts fall into two categories. Efforts within the first category are aimed at creating complex three-dimensional capacitors; those within the second are aimed at improving the dielectric of the planar capacitor.

The three-dimensional technique currently receiving the most attention involves the creation of "trench" capacitors in the cell substrate. FIG. 2 depicts a DRAM cell having a typical trench capacitor 21. Similar in concept to planar capacitor 11 of FIG. 1, the trench is employed to provide greater plate area, and hence, greater capacitance. The storage-node plate 22 may be formed from the n+ doped silicon substrate or it may be formed from a polysilicon layer which lines a trench cut in the n+ doped silicon substrate. The field plate 23 is formed from a layer of conductively-doped polycrystalline silicon. Storage-node plate 22 and field plate 23 are electrically insulated with a dielectric layer 24.

DRAM chips employing trench capacitors have been built by a number of European, Japanese and U.S. companies, including IBM Corporation, Texas Instruments Inc., Nippon Electric Company, Toshiba, Matsushita and Mitsubishi Electric Corporation. There are several problems inherent In the trench design, not the least of which is trench-to-trench capacitive charge leakage which is the result of a parasitic transistor effect between trenches. Another problem is the difficulty of completely cleaning the capacitor trenches during the fabrication process; failure to completely clean a trench will generally result in a defective cell.

Another three-dimensional technique, which is being used by Mitsubishi Electric Company, Hitachi, and Fujitsu Ltd., is the stacking of capacitor plates between dielectric layers on the DRAM cell surface. FIG. 3 is a graphic representation of a typical DRAM cell having a stacked capacitor 31. The lower (storage-node) plate 32 is formed from an n-type polycrystalline silicon layer which is in contact with the silicon substrate 33 in the region of the FET storage-node junction, while the upper (field) plate 34 is formed from a conductively-doped polycrystalline silicon layer. The two layers are separated by a dielectric layer 35. Lower plate 32 and upper plate 34 are both stacked on top of FET 12 and word line 36, resulting in a high-profile cell which requires more stringent process control for the connection of bit line 37 to access-node junction 38.

Alternatively, other schemes involve the use of ferroelectric materials for DRAM cell capacitor dielectrics. Since ferroelectric materials have a dielectric constant more than 100 times that of silicon oxides, the use of such materials has the potential for allowing the size of the DRAM cell capacitor to be shrunk to one of the smaller cell elements without resorting to three-dimensional structures. Critics of ferroelectric materials point out that such materials suffer from a "wearout" mechanism. In addition, they warn that there are many chemical incompatibilities with the other materials used in integrated circuit fabrication and that the layering of ferroelectric films within integrated circuit structures has not yet been done successfully.

In 1986, M. Olcer, H. J. Buhlmann and M. Ilegems described a process for texturizing monocrystalline silicon (hereinafter also "monosilicon" or "mono") in Volume 133 of the Journal of the Electrochemical Society. The process utilizes an anisotropic wet etch to slightly roughen the surface of the monosilicon. Use of monosilicon so textured has been suggested for use in EEPROMs.

A process for texturizing polycrystalline silicon (hereinafter also "polysilicon" or "poly") has been developed by Xicor, Inc. The Xicor process takes advantage of the greater reactivity of silicon atoms at the polysilicon crystal grain boundaries. When subjected to an anisotropic etch or a wet oxidation, the silicon atoms at the crystal grain boundaries are consumed at a faster rate than are those within the crystals. As a result of this differential in consumption rates, a texturization pattern is soon established on the polysilicon, giving it a granular appearance dependent upon the size of the polysilicon crystals.

Xicor has used texturized polysilicon to increase electron injection during write and erase operations in electrically-erasable programmable read-only memory (EEPROM) cells. During EEPROM construction, texturization is followed by thermal oxidation of the texturized surface. The bumps on the surface of the poly create regions of increased electric field strength, which both lowers breakdown voltage of the thermally-grown silicon dioxide and enhances current leakage by several orders of magnitude. In this application, the thermally-grown silicon dioxide, in which conduction is electrode limited in accordance with what is known as the Fowler-Nordheim mechanism, functions as a tunneling layer.

Texturized polysilicon has also been used by the instant inventors to increase capacitance of DRAM cells. In order to avoid the tunneling effect—useful for the Xicor-developed EEPROM memories, but certain to cause information-destroying low-voltage breakdown in a DRAM cell—the use of a thin-layer silicon dioxide dielectric between two roughened or texturized surfaces is precluded. However, dielectrics such as silicon nitride or tantalum pentoxide, which demonstrate bulk-limited conduction, most likely in accordance with what is known as the Frankel-Poole mechanism, are much more suitable as thin-layer dielectrics for use in DRAMs where capacitive layers are not smooth.

Since the polysilicon texturization is only applicable to DRAM memories which utilize a polysilicon for storage-node capacitor plates, the process is unusable for other DRAM memories. For example, planar DRAM memory arrays are typically constructed on a monocrystalline silicon (hereinafter also "monosilicon" or "mono") substrate and utilize the substrate for the storage-node capacitor plates. Since there are no crystal boundaries within such arrays, it would be impossible to achieve texturization of the monosilicon substrate through direct use of the etch or oxidation method that has been developed for the texturization of polysilicon. A process for texturizing monocrystalline silicon would clearly be useful.

SUMMARY OF THE INVENTION

The present invention is applicable primarily to dynamic random access memories (DRAMs) which utilize planar capacitor cell designs. Typically, planar DRAM cell capacitors employ a portion of the monocrystalline silicon (hereinafter also "mono") substrate, that is an extension of the cell's FET storage-node junction, for the capacitor's storage-node plate.

A texturization process, which uses a thin superjacent polycrystalline silicon (hereinafter also "poly") starter layer, is employed for texturizing a monocrystalline silicon substrate to create a three-dimensional texturized surface on the upper surface of the mono substrate. Following the deposition of a polycrystalline silicon starter layer of substantially uniform thickness on top of the monosilicon substrate, the polysilicon starter layer is anisotropically etched or oxidized to create a texturization pattern on the starter layer.

The texturization pattern develops because the poly etches and oxidizes more rapidly at the crystal grain boundaries within the poly layer. Thus, the surface of the polysilicon starter layer acquires a texturized topography having a granular appearance. The polysilicon crystals produce convex surface features, appearing similar to rounded hillocks. The crystal grain boundaries, where the etching and oxidation occurs more rapidly, produce concave surface features, appearing similar to valleys. The size of the polysilicon crystals determine the sizing and separation of the convex and concave surface features.

Once a pattern is established on the starter layer, it may be transferred to the underlying mono substrate by utilizing either an anisotropic etch or a wet oxidation to consume the balance of the starter layer. Since the silicon consumption reaction (whether it be wet oxidation or anisotropic etch) reaches the poly-mono interface at the poly crystal grain boundaries first, maximum transfer of the pattern has transferred to the underlying mono silicon as soon as the last remnant of the poly starter layer is consumed.

In order to maximize texturization on the underlying mono silicon, it is important that the consumption reaction be halted as soon as consumption of the starter layer is complete. Otherwise, the degree of texturization will begin to diminish as the natural tendency toward greater entropy works to smooth the textured surface. If oxidation has been employed to consume the starter layer and the small portion of the mono silicon layer necessary to transfer the texturization thereto, an oxide etch of the mono substrate is required to remove accumulated silicon dioxide, thus exposing the texturized mono surface.

This texturization process is repeated to further texturize the mono substrate. Another polycrystalline silicon starter layer of substantially uniform thickness is deposited on top of the monosilicon substrate and anisotropically etched or oxidized to create a new texturization pattern on the new starter layer. As before, the new texturization pattern develops because the poly etches and oxidizes more rapidly at the crystal grain boundaries within the poly layer.

However, the subsequent poly starter layer's uniquely and randomly distributed crystal grain boundaries are not aligned with those of the preceding poly starter layer. Therefore, the etching or oxidation produces a consumption reaction which reaches the poly-mono interface at the new poly crystal grain boundaries first, thereby transferring the new texturization pattern to the already texturized underlying mono silicon. This repeated texturization produces further substrate surface asperities, which in turn, increase the effective surface area available for the capacitor plates of the DRAM cell.

Monosilicon texturized in accordance with the present invention may be used in a variety of applications. For example, it may be used to increase electron injection in EEPROMs and may also be used to increase DRAM cell capacitance.

With multiple texturization complete, a thin (70–100 angstroms thick) silicon nitride layer is deposited on top of the texturized mono substrate, followed by the deposition of a cell plate poly layer, which functions as the upper, or field, capacitor plate. Since the nitride layer is conformal in nature, and thin in comparison to the bumps on the surface of the monocrystalline silicon substrate, the texture of the substrate is transferred through the silicon nitride layer to the cell plate layer. The effective capacitive plate area is substantially augmented, resulting in a cell capacitance increase of at least approximately fifty percent in comparison to a conventional planar cell utilizing identical wafer surface area.

Because conduction in silicon dioxide is electrode limited, generally considered to be in accordance with what is known as the Fowler-Nordheim mechanism, the use of thin layers of silicon dioxide as a DRAM cell dielectric between two roughened surfaces is precluded, since low-voltage breakdown is likely. However, because conduction in silicon nitride is bulk limited, most likely in accordance with what is known as the Frankel-Poole mechanism, silicon nitride is a much more suitable thin layer dielectric for use in DRAMs where capacitive layers are not smooth.

BRIEF DESCRIPTION OF THE DRAWINGS

Throughout the figures, similar elements are designated by similar reference numerals.

FIG. 1 is a cross-sectional view of a DRAM cell having a conventional planar capacitor;

FIG. 2 is a cross-sectional view of a DRAM cell having a typical trench capacitor;

FIG. 3 is a cross-sectional view of a DRAM cell having a typical stacked capacitor;

FIG. 4 is a cross-sectional view of a DRAM cell of planar-capacitor design during the fabrication process, subsequent to the creation of the cell's field effect transistor gate and word line from a poly-1 layer and doping of the transistor's storage-node and access-node junction regions;

FIG. 5 is a cross-sectional view of the DRAM cell of FIG. 4 following the blanket deposition of a thin poly starter layer;

FIG. 6 is a cross-sectional view of the DRAM cell of FIG. 5 following texturization of the substrate regions;

FIG. 7 is a cross-sectional view of the DRAM cell of FIG. 6 following a silicon dioxide etch, blanket deposition of a silicon nitride layer, deposition of a poly cell plate layer, and masking of the poly field plate layer with a photoresist mask; and FIG. 8 is a cross-sectional view of the DRAM cell of FIG. 7 following the etching of the poly cell plate layer and the silicon nitride layer;

FIG. 9 is a cross-sectional view of the DRAM cell of FIG. 8, completed in accordance with conventional processing technology;

FIG. 10 is a cross-sectional view of a polysilicon-starter-layer-covered monosilicon substrate;

FIG. 11 is a cross-sectional view of the monosilicon substrate of FIG. 10 following a wet oxidation that has consumed a portion of the polysilicon starter layer and created texturization thereon;

FIG. 12 is a cross-sectional view of the monosilicon substrate of FIG. 11 following continued wet oxidation that has consumed the polysilicon starter layer to the point where the oxidation reaction has reached the polysilicon-monosilicon interface;

FIG. 13 is a cross-sectional view of the monosilicon substrate of FIG. 12 following continued wet oxidation that has entirely consumed the starter layer and a small portion of the substrate, transferring texturization from the starter layer to the substrate;

FIG. 14 is a cross-sectional view of the monosilicon substrate of FIG. 13 following an oxide etch that has removed the silicon dioxide accumulated during the wet oxidation;

FIG. 15 is a cross-sectional view of a polysilicon-starter-layer-covered, texturized monosilicon substrate;

FIG. 16 is a cross-sectional view of the texturized monosilicon substrate of FIG. 15 following a wet oxidation that has consumed a portion of the polysilicon starter layer and created texturization thereon;

FIG. 17 is a cross-sectional view of the texturized monosilicon substrate of FIG. 16 following continued wet oxidation that has consumed the polysilicon starter layer to the point where the oxidation reaction has reached the polysilicon-monosilicon interface;

FIG. 18 is a cross-sectional view of the texturized monosilicon substrate of FIG. 12 following continued wet oxidation that has entirely consumed the starter layer and a small portion of the texturized substrate, transferring further texturization from the starter layer to the previously texturized substrate;

FIG. 19 is a cross-sectional view of the texturized monosilicon substrate of FIG. 18 following an oxide etch that has removed the silicon dioxide accumulated during the wet oxidation;

FIG. 20 is a cross-sectional view of the monosilicon substrate of FIG. 10 following an anisotropic etch which imparts texturization to the polysilicon starter layer;

FIG. 21 is a cross-sectional view of the monosilicon substrate of FIG. 20 following continued anisotropic etching that has consumed the polysilicon starter layer to the point where the anisotropic etch has reached the polysilicon-monosilicon interface;

FIG. 22 is a cross-sectional view of the monosilicon substrate of FIG. 21 following continued anisotropic etching that has completely transferred texturization on the polysilicon starter layer to the monosilicon substrate;

FIG. 23 is a cross-sectional view of the texturized monosilicon substrate of FIG. 15 following an anisotropic etch which imparts texturization to the polysilicon starter layer;

FIG. 24 is a cross-sectional view of the texturized monosilicon substrate of FIG. 23 following continued anisotropic etching that has consumed the polysilicon starter layer to the point where the anisotropic etch has reached the polysilicon-monosilicon interface;

FIG. 25 is a cross-sectional view of the texturized monosilicon substrate of FIG. 24 following continued anisotropic etching that has completely transferred further texturization on the polysilicon starter layer to the previously texturized monosilicon substrate;

FIG. 26 is a cross-sectional view of the monosilicon substrate of FIG. 11 following an oxide etch that has removed oxide that accumulated on the polysilicon starter layer during the wet oxidation thereof;

FIG. 27 is a cross-sectional view of the monosilicon substrate of FIG. 26 following an anisotropic etch that has consumed the remaining portion of the polysilicon starter layer and a small portion of the monosilicon substrate, thus transferring the texturization pattern from the starter layer to the underlying substrate;

FIG. 28 is a cross-sectional view of the texturized monosilicon substrate of FIG. 16 following an oxide etch that has removed oxide that accumulated on the polysilicon starter layer during the wet oxidation thereof; and FIG. 29 is a cross-sectional view of the texturized monosilicon substrate of FIG. 28 following an anisotropic etch that has consumed the remaining portion of the polysilicon starter layer and a small portion of the previously texturized monosilicon substrate, thus transferring the further texturized pattern from the starter layer to the underlying previously texturized substrate.

DETAILED DESCRIPTION OF THE INVENTION

A DRAM cell capacitor in accordance with the present invention is described first, with references to FIGS. 4 through 9. DRAM cell substrate texturization processes in accordance with the present invention are then described, with references to FIGS. 10 through 29.

DRAM Cell Capacitor

Figure 1:
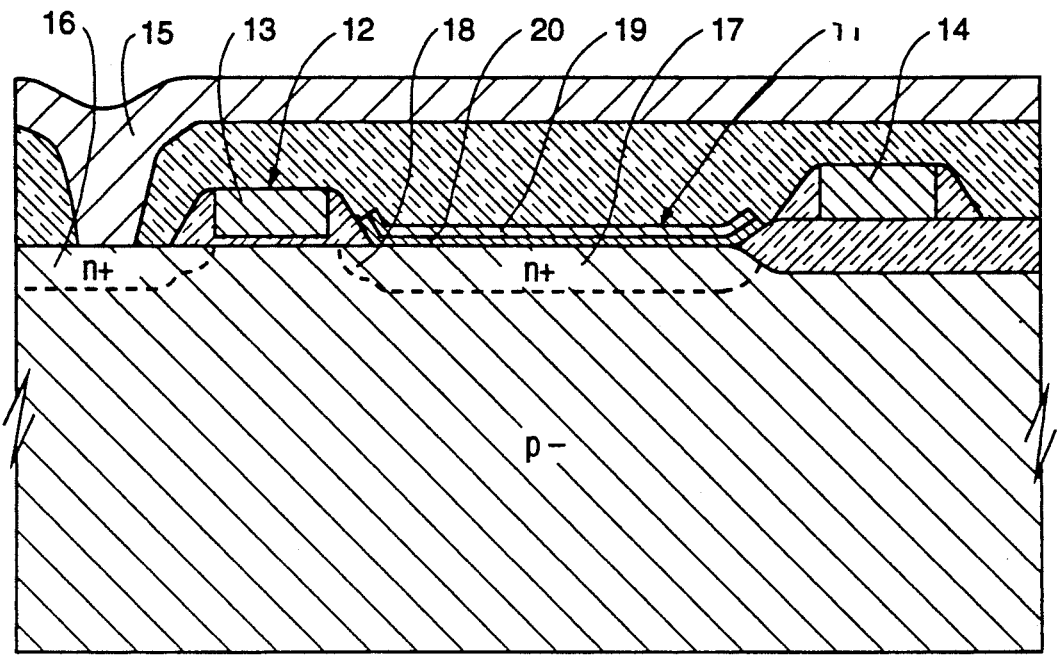
FIGS. 1 through 3 depict existing technologies.
Figure 2:
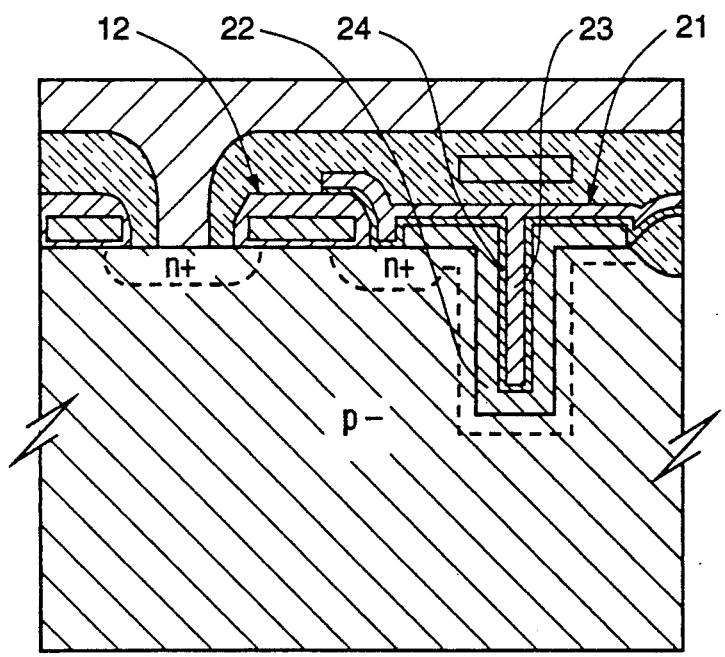
Figure 3:
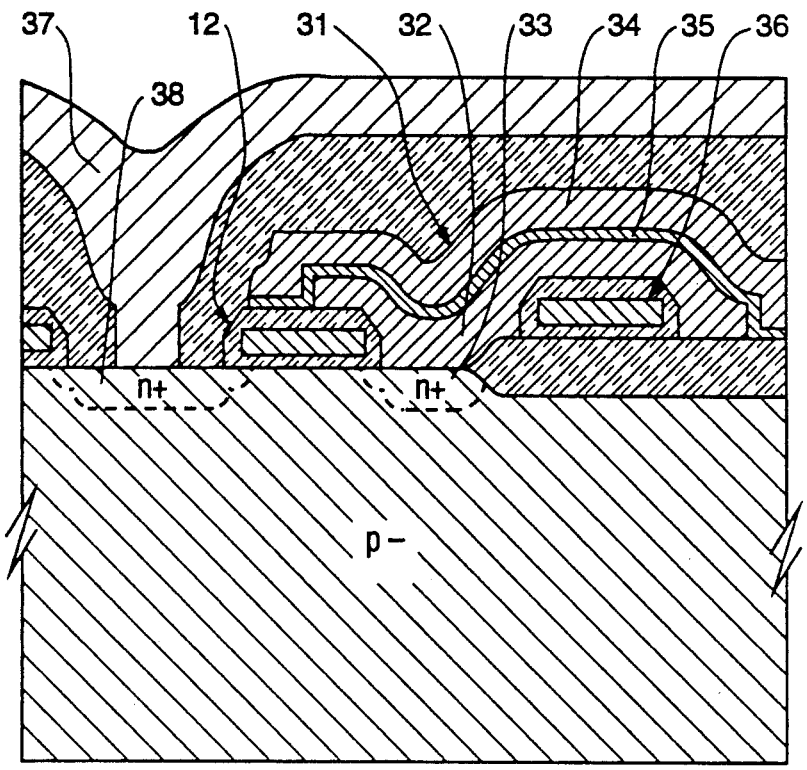
Figure 4:
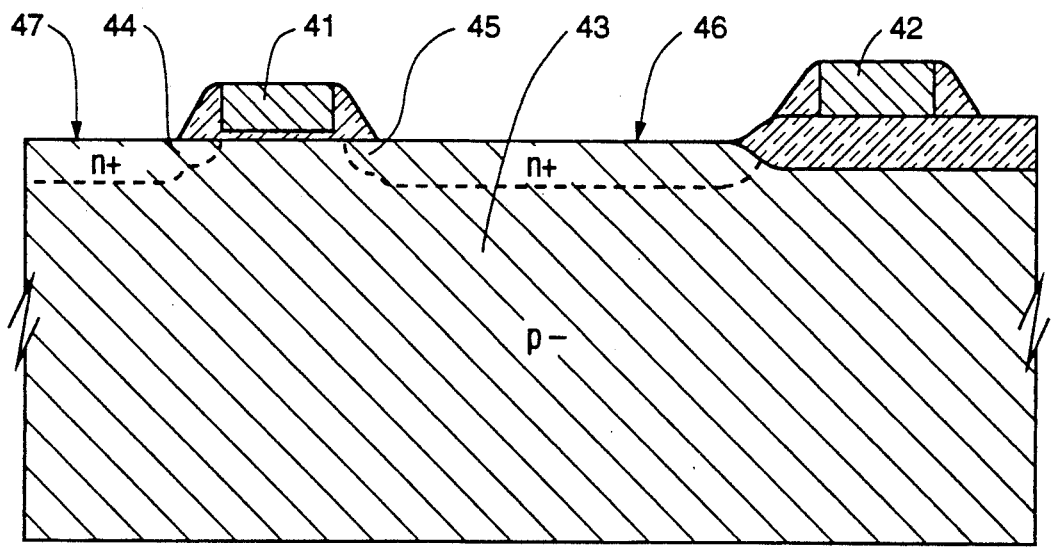
FIGS. 4 through 9 depict the fabrication of a DRAM array having a capacitor design conforming to the present invention.

Referring now to FIG. 4, a DRAM cell of planar design is shown during the early stages of the fabrication process. A field effect transistor gate 41 and a word line 42 (the interconnect between FET gates in an array column) have been created from a conductively-doped poly-1 layer. Self-aligned heavy doping of a lightly-doped p-type substrate 43 with phosphorus and arsenic has created n-type FET access-node junction 44 and n-type FET storage-node junction 45. A cell capacitor will be constructed on the exposed n-type substrate capacitive region 46 that, in FIG. 4, is to the right of storage-node junction 45. A bit line will make contact with the exposed n-type substrate bit-line-contact region 47 that is to the left of access-node junction 44.

Figure 5:
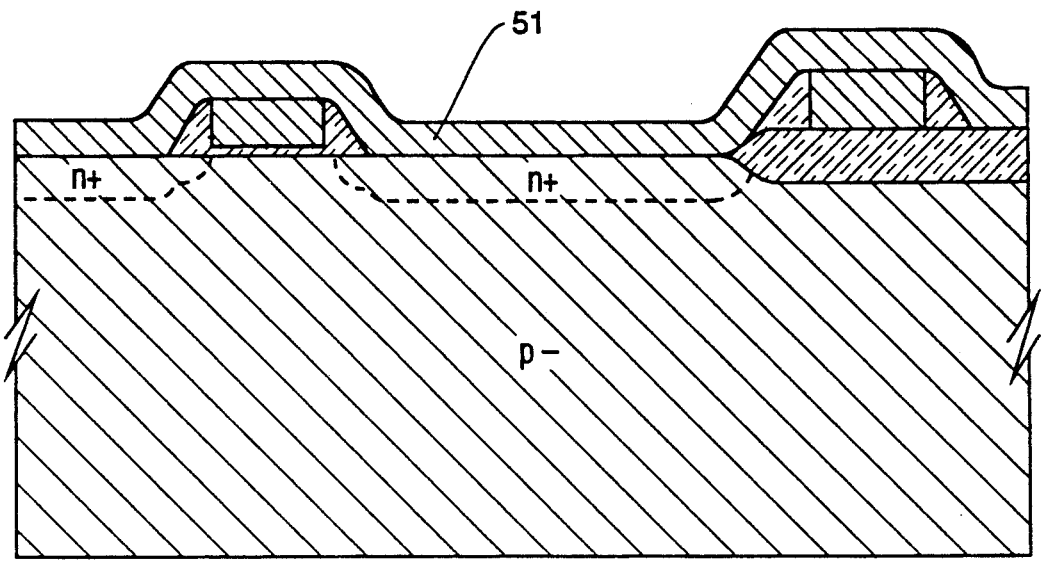

Referring now to FIG. 5, the monocrystalline silicon texturization process is begun with the blanket deposition of a polycrystalline silicon poly starter layer 51 of substantially uniform thickness over the surface of the cell. The optimum thickness of poly starter layer 51 will be determined by the crystal grain size and dopant concentration of poly starter layer 51. A substantially uniform thickness of approximately 1,000–2,000 angstroms will provide good texturization.

Figure 6:
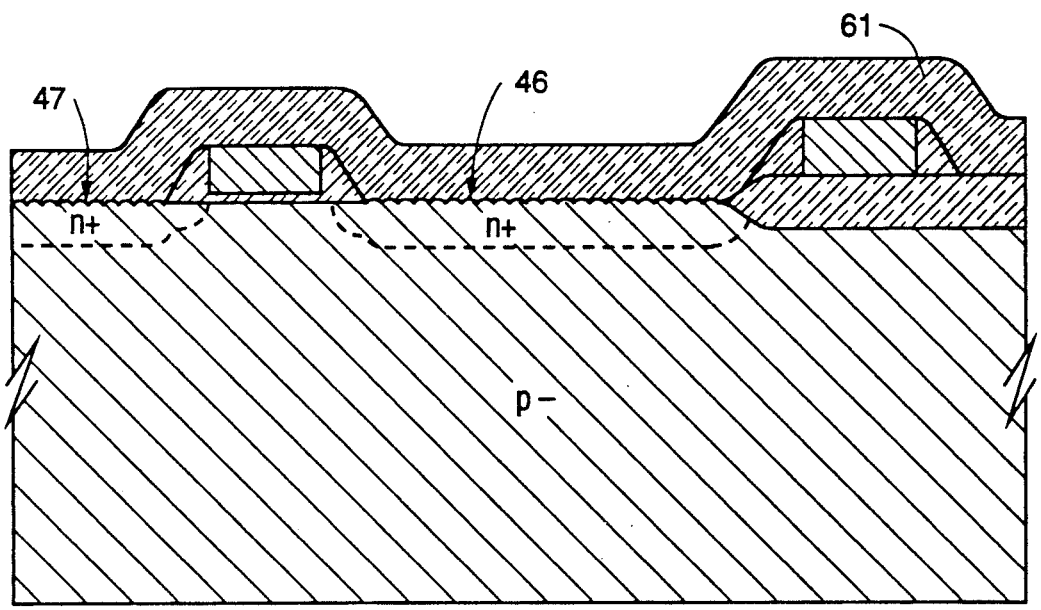

Referring now to FIG. 6, the cell has been subjected to wet oxidation. Since oxidation proceeds more rapidly at crystal grain boundaries than in the center of a crystal, the exposed surface of poly starter layer 51 becomes texturized as oxidation continues. Texturization occurs because the poly etches and oxidizes more rapidly at the crystal grain boundaries within the poly layer. Thus, the surface of the polysilicon starter layer acquires a texturized topography having a granular appearance. The polysilicon crystals produce convex surface features, appearing similar to rounded hillocks. The crystal grain boundaries, where the etching and oxidation occurs more rapidly, produce concave surface features, appearing similar to valleys. The size of the polysilicon crystals determine the sizing and separation of the convex and concave surface features.

As poly starter layer 51 becomes consumed, the texture thereon is transferred to the underlying monocrystalline substrate. The wet oxidation step may be terminated as soon as poly starter layer 51 has been entirely consumed. At that point, maximum transfer of texturization will have occurred. As a result of the oxidation of poly starter layer 51 and portions of both underlying substrate regions 46 and 47, silicon dioxide layer 61 has grown on top of both substrate region 46 and 47.

The poly starter layer 51 should be deposited substantially uniformly to avoid planarization of the underlying monocrystalline substrate. If the poly starter layer 51 is not of substantially uniform thickness, surface asperities otherwise produced by the oxidation (or etching as discussed below) at the crystal grain boundaries can be minimized from the resulting nonuniform transfer of the texturization pattern to the underlying substrate.

Figure 7:
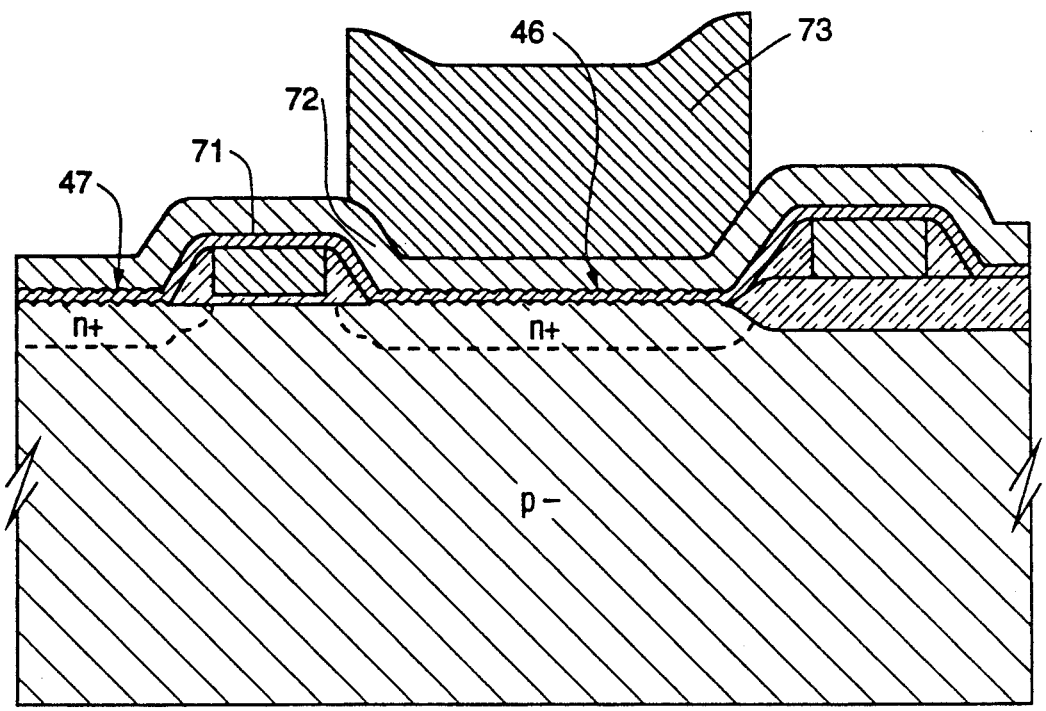

Referring now to FIG. 7, silicon dioxide layer 61 has been removed with a wet oxide etch, exposing the textured surfaces of substrate capacitive region 46 and substrate bit-line-contact region 47.

Although the texturization process just described appears to be the most controllable means of imparting a texture to a monocrystalline substrate, texturization may also be accomplished using two other, somewhat similar, processes. Using the first alternative method, the poly starter layer is etched anisotropically, with consumption of the material occurring more rapidly along the polycrystalline boundaries than in the center of the crystal. Thus, a texturized surface is created on the poly starter layer. When the poly layer has been entirely consumed, the texturized pattern is transferred to the underlying mono substrate.

Using the second alternative method, a wet oxidation step and a subsequent oxide etch are used to create a texturized surface on the thin poly starter layer. An anisotropic etch consumes the poly starter layer and transfers the texture on the poly to the underlying mono layer.

As discussed more fully below, this texturization of the monosilicon substrate 43 is performed multiple times. Successive, subsequent poly starter layers 51 are deposited and consumed, as described above. Each successive poly starter layer 51 has its own unique crystal grain boundaries which will be randomly superimposed over the unique locations of the respective crystal grain boundaries of the preceding poly starter layers 51. This results in more asperities forming in the surface of the substrate 43, and therefore, greater surface area, as compared to a nontexturized substrate.

In any case, once the texturization process has been completed, a silicon nitride layer 71, approximately 70–100 angstroms thick, is blanket deposited over the surface of the cell. This is followed with the blanket deposition of a poly-2 cell plate layer 72. Following the doping of poly-2 layer 72 with phosphorus to render it conductive, poly-2 layer 72 is masked with a photoresist mask 73.

Figure 8:
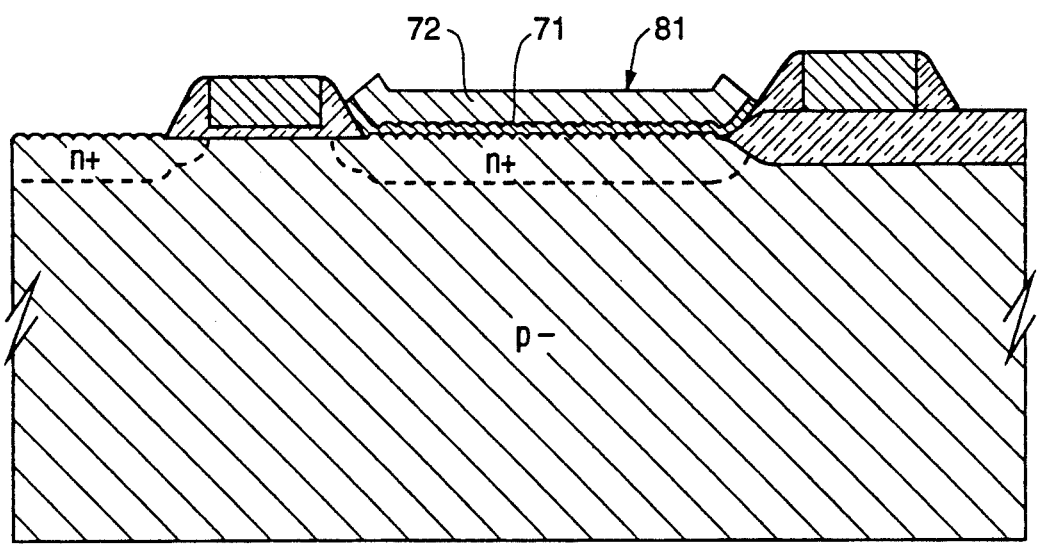

Referring now to FIG. 8, poly-2 layer 72 and silicon nitride layer 71 have been etched to form a cell plate 81, which will function as the cell's field capacitor plate. The cell capacitor is now complete.

Figure 9:
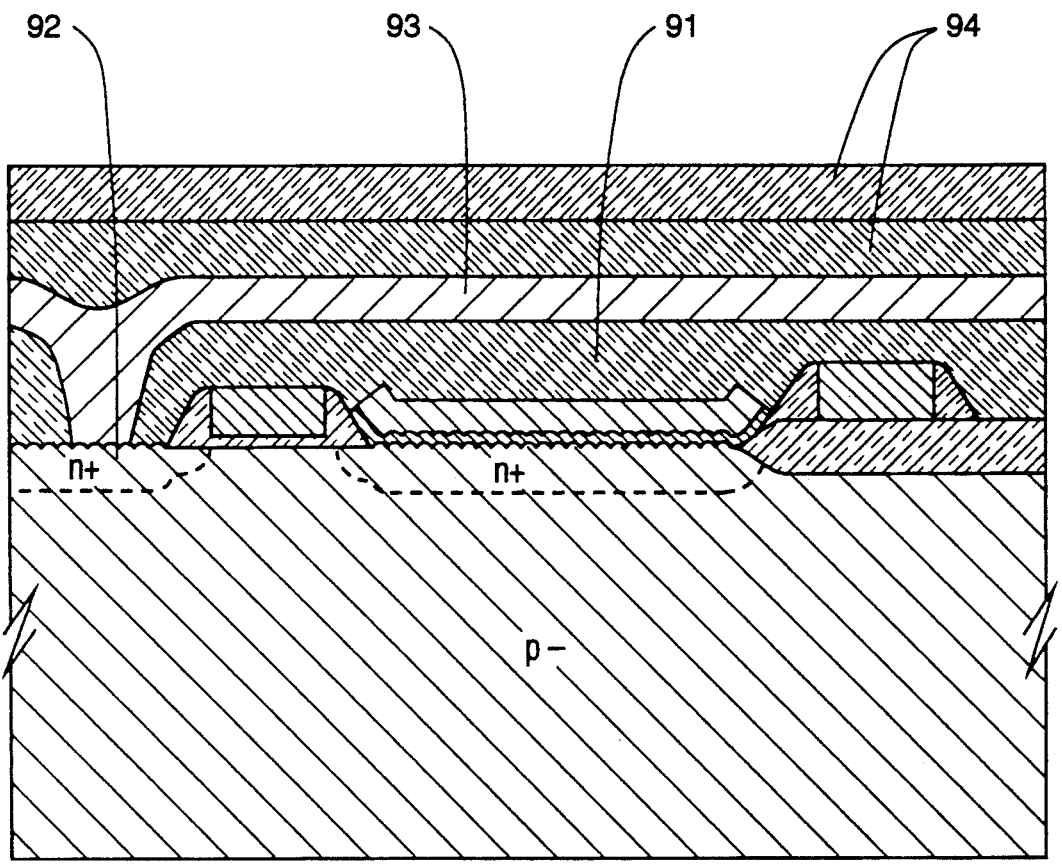

Referring now to FIG. 9, the cell (as well as the entire array of which the cell is but a small part) has been completed in a conventional manner. A borophosphoro-silicate glass (BPSG) layer 91 has been blanket deposited over the surface of the cell. Following an oxide etch which exposes a bit-line contact point at the FET access-node junction region 92, aluminum metal is blanket deposited over the cell's surface, and then etched to form bit line 93. Blanket deposition of passivation layers 94 follows.

Substrate Texturization Processes

A first embodiment of the texturization process includes the steps described in FIGS. 10 through 19.

Figure 10:
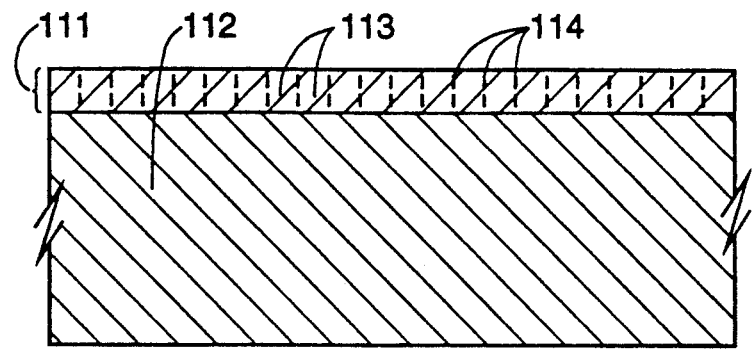
FIGS. 10 through 29 depict processes for texturizing a DRAM substrate to fabricate a DRAM array having a capacitor design conforming to the present invention.

Referring now to FIG. 10, a polysilicon starter layer 111 having a substantially uniform thickness in the range of approximately 500 to 5,000 angstroms (the optimum thickness is deemed to be approximately 1,000-2,000 angstroms) is deposited on top of a monosilicon substrate 112. The boundaries between crystal grains 113 are represented by the broken lines 114.

Figure 11:
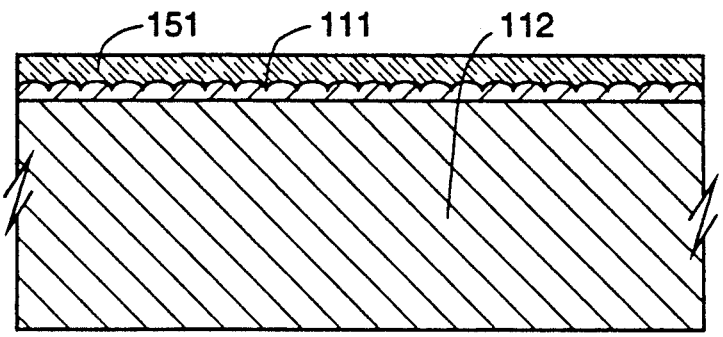

Referring now to FIG. 11, the monosilicon substrate 112 and superjacent polysilicon starter layer 111 of FIG. 10 have been subjected to a wet oxidation that has consumed a portion of the polysilicon starter layer 111 and created texturization thereon. As discussed more fully below for FIG. 20 with the anisotropic etch, consumption of the polysilicon starter layer 111 proceeds more rapidly at crystal grain boundaries. As the wet oxidation consumes polysilicon starter layer 111, a layer of silicon dioxide 151 accumulates on top of the textured surface of starter layer 111.

Figure 12:
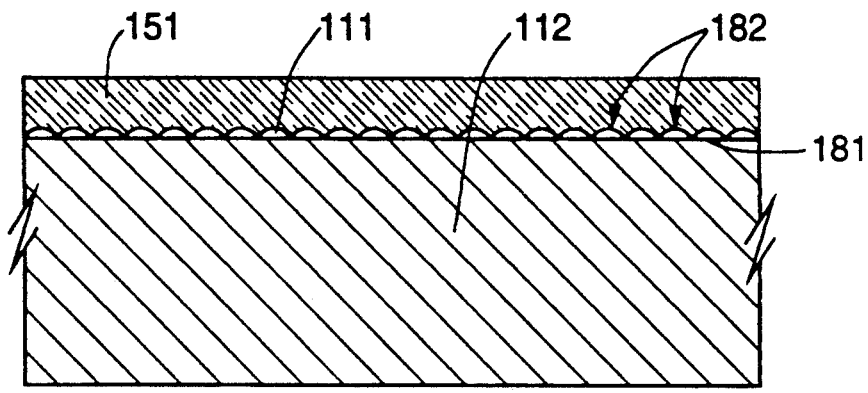

Referring now to FIG. 12, the monosilicon substrate 112 and superjacent polysilicon starter layer 111 of FIG. 11 are further subjected to wet oxidation, resulting in consumption of the polysilicon starter layer to the point where the oxidation reaction has reached the polysilicon-monosilicon interface 181. At this point, monocrystalline silicon from substrate 112 is being consumed between the crystal grain boundaries of the remaining portion of polysilicon starter layer 111. In this representation, starter layer has been consumed to the point that only non-contiguous bumps 182 remain on the surface of monosilicon substrate 112. Silicon dioxide layer 151 has continued to increase in thickness as silicon is consumed.

Figure 13:
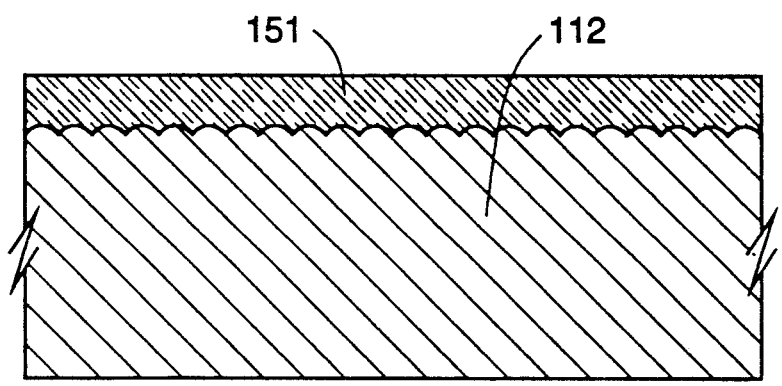

Referring now to FIG. 13, further oxidation of monosilicon substrate 112 and superjacent polysilicon starter layer 111 has resulted in the consumption of the entire starter layer 111 and a small portion of substrate 112, transferring texturization from starter layer 111 to substrate 112. Silicon dioxide layer 151 has become even thicker.

Figure 14:
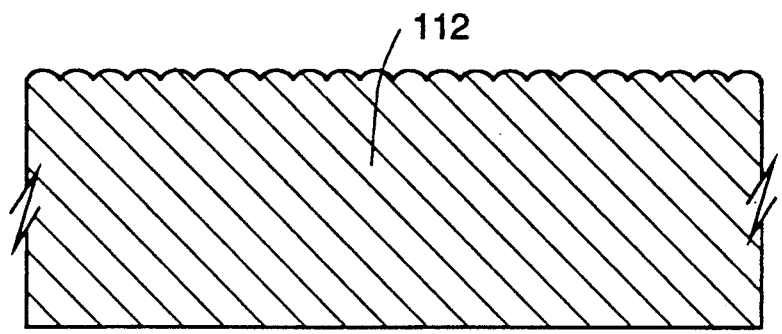

Referring now to FIG. 14, an oxide etch has removed silicon dioxide layer 151, thus exposing the texturized surface of monosilicon substrate 112.

Figure 15:
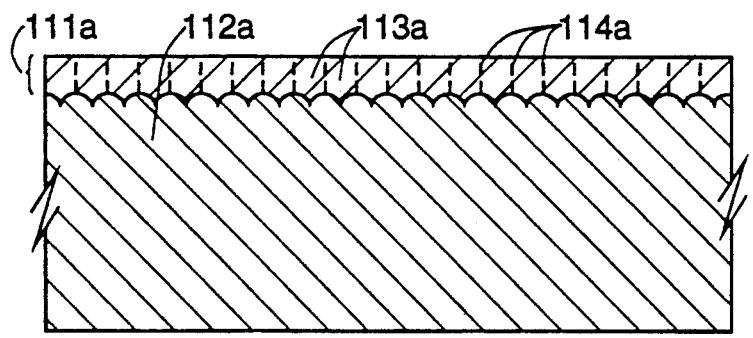

Referring now to FIG. 15, another polysilicon starter layer 111a having a thickness in the range of approximately 500 to 5,000 angstroms is deposited on top of the texturized monosilicon substrate 112a. The boundaries between its crystal grains 113a are represented by the broken lines 114a. Due to the randomness of the locations of the new crystal grains 113a, their boundaries 114a may not necessarily be superimposed over the corresponding locations of the crystal grain boundaries 114 of the preceding starter layer 111.

Figure 16:
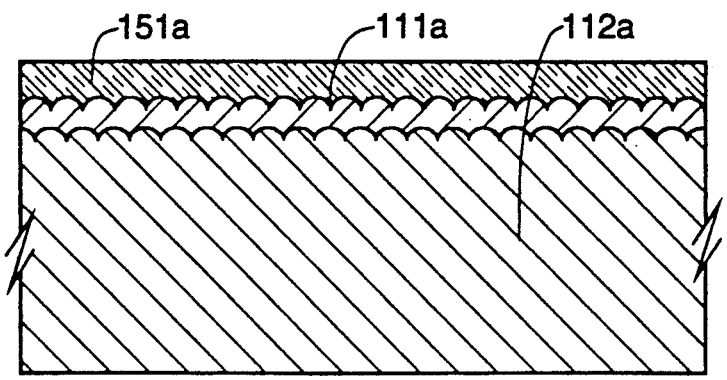

Referring now to FIG. 16, the texturized substrate 112a and superjacent polysilicon starter layer 111a of FIG. 15 have been subjected to a wet oxidation that has consumed a portion of the polysilicon starter layer 111a and created texturization thereon. Again, consumption of the polysilicon starter layer 111a proceeds more rapidly at crystal grain boundaries 114a. As the wet oxidation consumes polysilicon starter layer 111a, a layer of silicon dioxide 151a accumulates on top of the textured surface of starter layer 111a.

Figure 17:
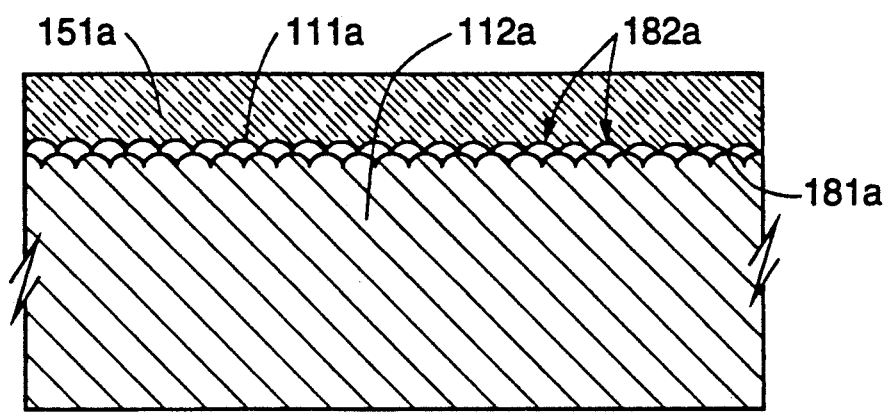

Referring now to FIG. 17, the texturized substrate 112a and superjacent polysilicon starter layer 111a of FIG. 16 are further subjected to wet oxidation, resulting in consumption of the polysilicon starter layer 111a to the point where the oxidation reaction has reached the polysilicon-monosilicon interface 181a. At this point, monocrystalline silicon from substrate 112a is being consumed between the crystal grain boundaries 114a of the remaining portion of polysilicon starter layer 111a. In this representation, the starter layer 111a has been consumed to the point that only non-contiguous bumps 182a remain on the surface of monosilicon substrate 112a. Silicon dioxide layer 151a has continued to increase in thickness as silicon is consumed.

Figure 18:
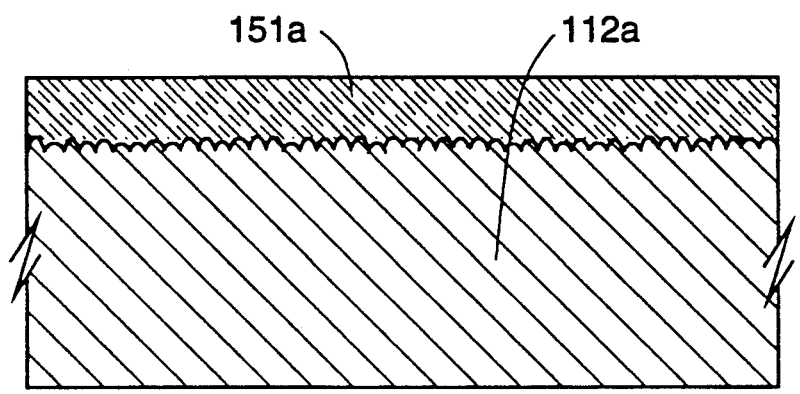

Referring now to FIG. 18, further oxidation of texturized substrate 112a and superjacent polysilicon starter layer 111a has resulted in the consumption of the entire new starter layer 111a and a small portion of substrate 112a, transferring additional texturization from the starter layer 111a to the previously texturized substrate 112a. Silicon dioxide layer 151a has become even thicker.

Thus, as consumption of the new polysilicon starter layer 111a is completed, consumption of the texturized substrate 112a occurs along the new crystal grain boundaries 114a, i.e. between the old crystal grain boundaries 114. This produces more asperities per unit area, and therefore, more surface area, i.e. more exposed surface per unit area of substrate 112a.

The sizing and separation of these surface asperities, e.g. convex and concave substrate surface features, are dependent upon the size of the polysilicon crystals. Typical sizes of such crystals are approximately 0.1-0.2 microns. Therefore, after the initial texturization, typical sizing and separation of the surface asperities will be 0.1-0.2 microns. Following subsequent texturizations, their typical sizing and separation will be less than 0.1 microns.

This is consistent with the sizing and separation of polysilicon surface asperities disclosed by Simko in U.S. Pat. No. 4,300,212. Simko discloses electrodes of singly texturized polysilicon for an electrically erasable, programmable read-only memory (EEPROM). Simko's singly texturized polysilicon has surface asperities with an approximate areal density of $5 \times 10^9$ per square centimeter ($cm^2$), an average base width of 456 angstroms (Å) and an average height of 762 angstroms.

Figure 19:
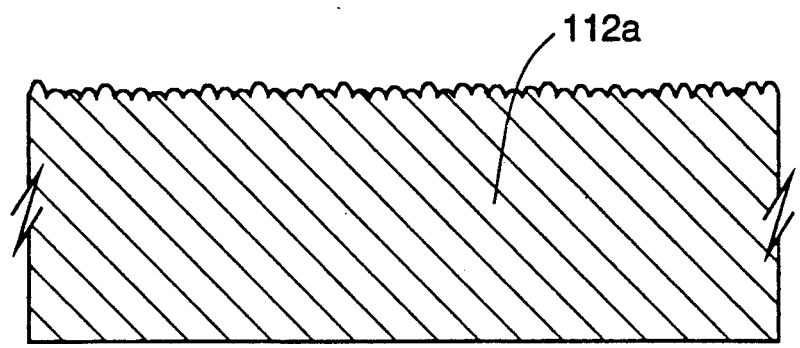

Referring now to FIG. 19, an oxide etch has removed silicon dioxide layer 151a, thus exposing the further texturized surface of the previously texturized substrate 112a.

A second embodiment of the texturization process begins with FIG. 10 and includes the steps described in FIGS. 20 through 25.

Figure 20:
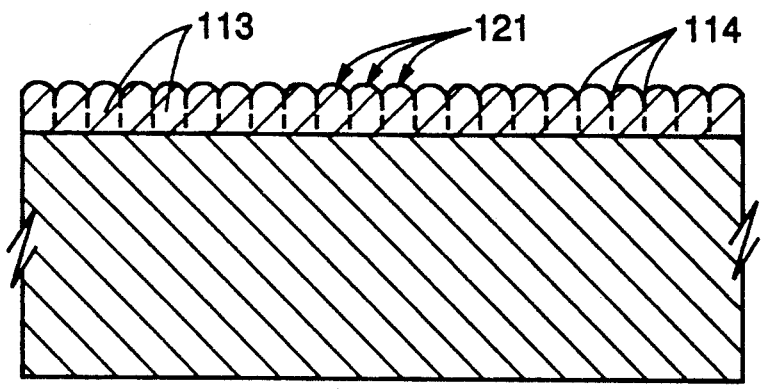

Referring now to FIG. 20, polysilicon starter layer 111 (of FIG. 10) has been subjected to an anisotropic etch, which causes the surface of polysilicon starter layer 111 to develop a multitude of bumps 121, which equate to a texturized surface. The texturized surface develops because the polysilicon etches more rapidly at the boundaries 114 of the crystal grains 113 than in their centers.

Figure 21:
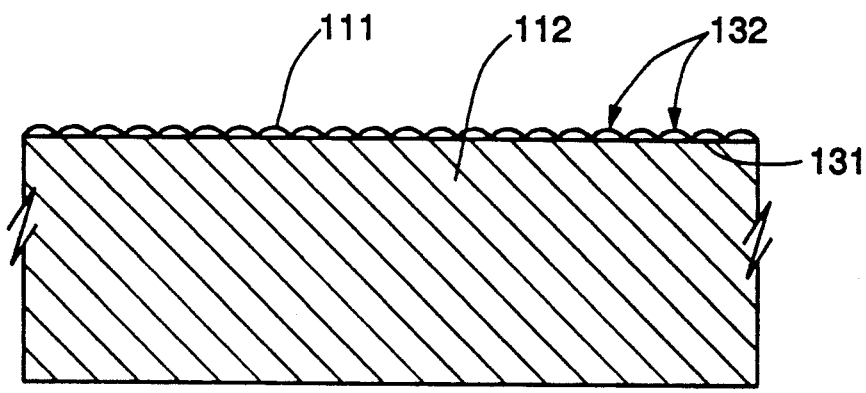

Referring now to FIG. 21, the anisotropic etch is continued until the polysilicon starter layer 111 has been consumed to the point where the etch has reached the polysilicon-monosilicon interface 131. At this point, monocrystalline silicon from substrate 112 is being consumed between the crystal grain boundaries of the remaining portion of polysilicon starter layer 111. In this representation, starter layer 111 has been consumed to the point that only noncontiguous bumps 132 remain on the surface of monosilicon substrate 112.

Figure 22:
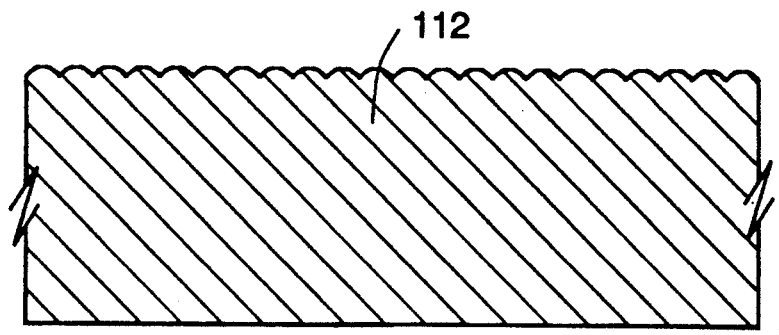

Referring now to FIG. 22, the anisotropic etch is continued still further until the polysilicon starter layer 111 has been entirely etched away, thus transferring the texturization that was previously on starter layer 111 to the underlying substrate 112.

Figure 23:
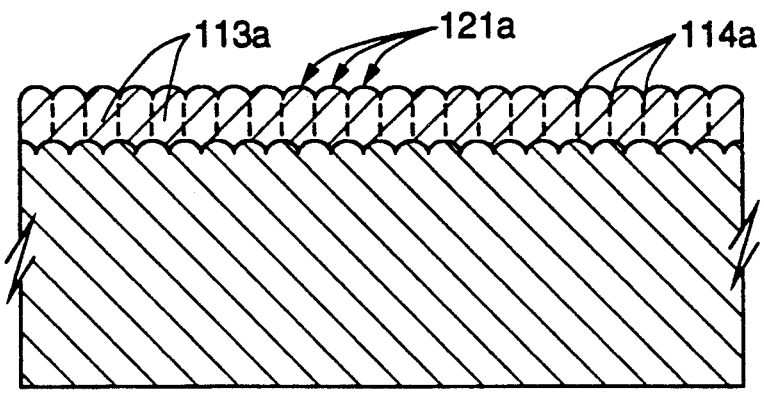

Referring now to FIG. 23, another polysilicon starter layer 111a has been subjected to another anisotropic etch, which causes the surface of polysilicon starter layer 111a to develop another multitude of bumps 121a, which equate to another texturized surface. As discussed above, the texturized surface develops because the polysilicon etches more rapidly at the boundaries 114a of the crystal grains 113a than in their centers.

Figure 24:
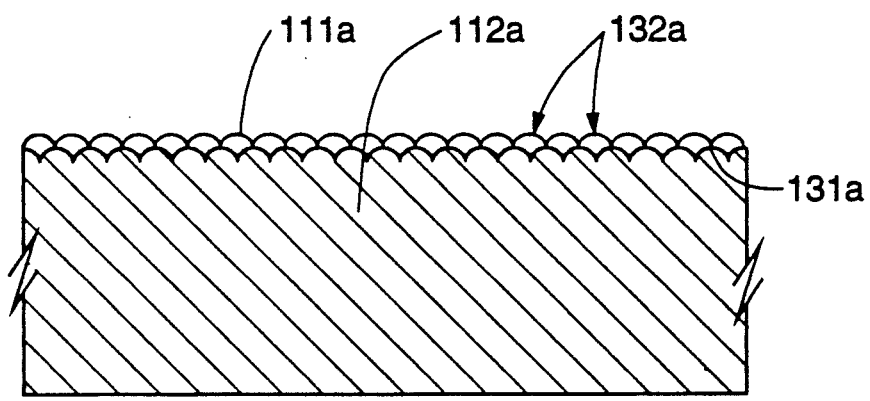

Referring now to FIG. 24, the anisotropic etch is continued until the polysilicon starter layer 111a has been consumed to the point where the etch has reached the polysilicon-monosilicon interface 131a. At this point, monocrystalline silicon from the previously texturized substrate 112a is being consumed between the crystal grain boundaries 114a of the remaining portion of the polysilicon starter layer 111a. In this representation, the starter layer 111a has been consumed to the point that only noncontiguous bumps 132a remain on the surface of the texturized substrate 112a.

Figure 25:
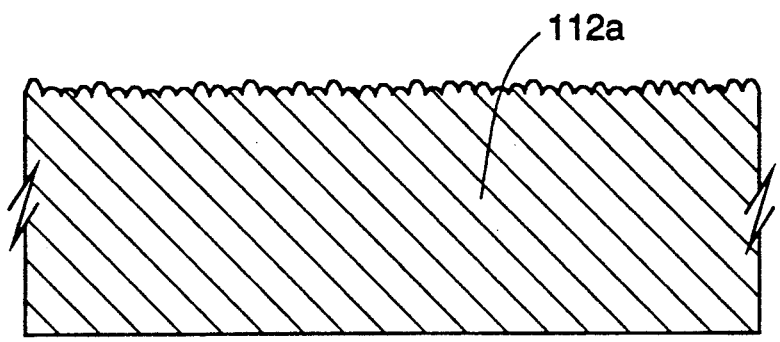

Referring now to FIG. 25, the anisotropic etch is continued still further until the polysilicon starter layer 111a has been entirely etched away, thus transferring the texturization that was previously on the starter layer 111a to the underlying previously texturized substrate 112a.

Thus again, consumption of the texturized substrate 112a occurs along the new crystal grain boundaries 114a between the old crystal grain boundaries 114. This produces more substrate 112a surface asperities per unit area, and therefore, more substrate 112a surface area.

A third embodiment of the texturization process begins with FIG. 10, includes the step described in FIGS. 11 and 16, and then further encompasses the steps described in FIGS. 26 through 29.

Figure 26:
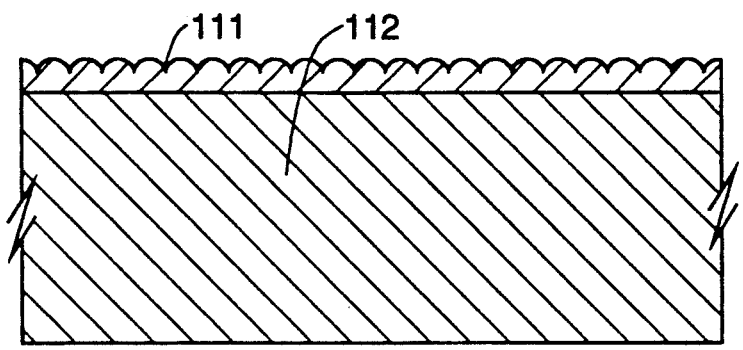

Referring now to FIG. 26, silicon dioxide layer 151 (of FIG. 11) has been removed with an oxide etch, exposing the texturized surface of polysilicon starter layer 111.

Figure 27:
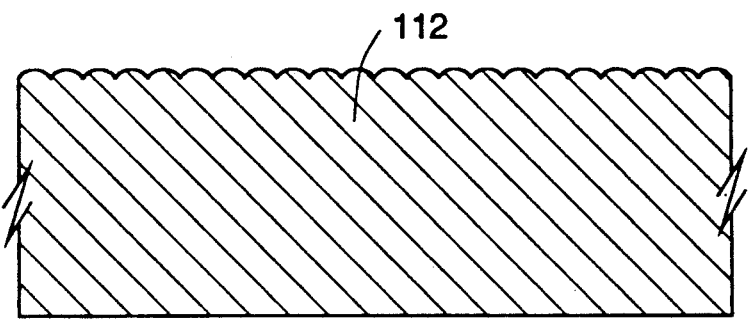

Referring now to FIG. 27, an anisotropic etch has consumed the remaining portion of the polysilicon starter layer 111 and a small portion of the monosilicon substrate 112, thus transferring the texturization pattern from the starter layer to the underlying substrate.

Figure 28:
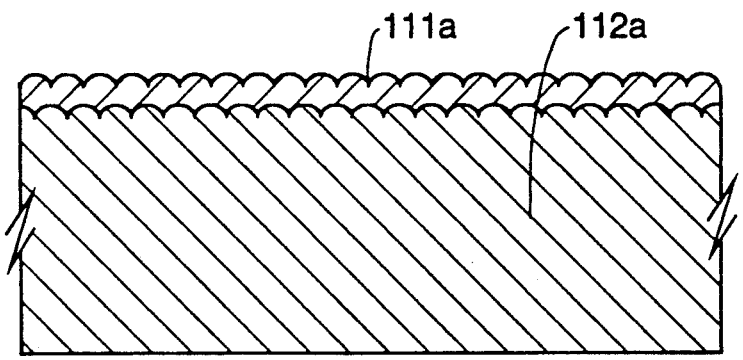

Referring now to FIG. 28, silicon dioxide layer 151a (of FIG. 16) has been removed with an oxide etch, exposing the texturized surface of polysilicon starter layer 111a.

Figure 29:
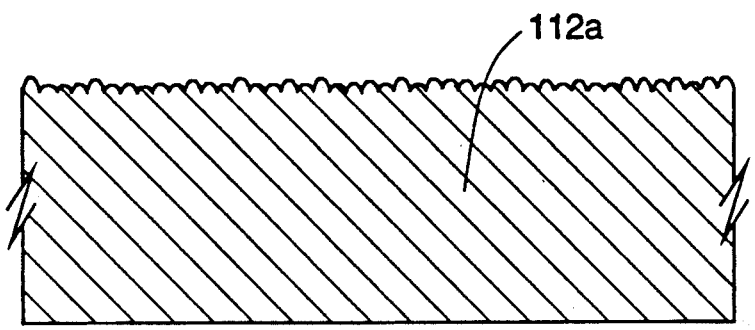

Referring now to FIG. 29, an anisotropic etch has consumed the remaining portion of the polysilicon starter layer 111a and a small portion of the previously texturized substrate 112a, thus transferring the texturization pattern from the starter layer 111a to the underlying substrate 112a.

Thus, as discussed above, consumption of the texturized substrate 112a occurs along the new crystal grain boundaries 114a between the old crystal grain boundaries 114. This produces more substrate 112a surface asperities per unit area, and therefore, more substrate 112a surface area.

It should be understood that the foregoing texturization steps can be further repeated as desired to still further texturize the texturized monosilicon substrate 112a. Repeated texturization will produce still further asperities within the texturized substrate 112a and thereby increase the effective surface areas of the DRAM cell capacitor plates. In turn, these increased plate areas produce a DRAM cell capacitor with enhanced capacitance.

Although only several embodiments of the present invention have been described, it will be apparent to one skilled in the art that changes and modifications may be made thereto without departing from the spirit and the scope of the invention as claimed.

What is claimed is:

1. A method of fabricating a memory cell storage capacitor, comprising the steps of:
    (a) conductively doping a region within a layer of silicon support material adjacent to a surface thereof;
    (b) texturizing said silicon layer surface a plurality of times to produce a texturization pattern thereof by:
        (i) depositing a layer of polysilicon of substantially uniform thickness as a sacrificial material upon said silicon layer surface, said polysilicon layer having an exposed surface;
        (ii) texturizing said exposed polysilicon surface;
        (iii) consuming substantially all of said polysilicon layer; and
        (iv) repeating steps (i) through (iv) at least once;
    (c) depositing a substantially conformal layer of dielectric material of substantially uniform thickness upon said texturized surface, said dielectric layer being sufficiently thin to allow said texturization pattern to transfer therethrough;
    (d) depositing a substantially conformal layer of polysilicon upon said layer of dielectric material;
    (e) conductively doping said conformal polysilicon layer.

2. A method as recited in claim 1, wherein said step of (ii) texturizing said exposed polysilicon surface comprises subjecting said exposed polysilicon surface to wet oxidation.

3. A method as recited in claim 2, wherein said step of (iii) consuming substantially all of said polysilicon layer comprises continuing said wet oxidation of said exposed polysilicon surface.

4. A method as recited in claim 2, wherein said step of (iii) consuming substantially all of said polysilicon layer comprises anisotropically etching said exposed polysilicon surface.

5. A method as recited in claim 1, wherein said step of (ii) texturizing said exposed polysilicon surface comprises anisotropically etching said exposed polysilicon surface.

6. A method as recited in claim 5, wherein said step of (iii) consuming substantially all of said polysilicon layer comprising continuing said anisotropically etching of said exposed polysilicon surface.

7. A process for texturizing a surface of monocrystalline silicon, comprising the steps of:
    (a) depositing a layer of polysilicon of substantially uniform thickness upon said silicon surface, said polysilicon layer having an exposed surface;
    (b) texturizing said exposed polysilicon surface;
    (c) comsuming substantially all of said polysilicon layer; and
    (d) repeating the foregoing steps at least once.

8. A process as recited in claim 7, wherein said step of (b) texturizing said exposed polysilicon surface comprises subjecting said exposed polysilicon surface to wet oxidation.

9. A process as recited in claim 8, wherein said step of (c) comsuming substantially all of said polysilicon layer comprises continuing said wet oxidation of said exposed polysilicon surface.

10. A process as recited in claim 8, wherein said step of (c) comsuming substantially all of said polysilicon layer comprises anisotropically etching said exposed polysilicon surface.

11. A process as recited in claim 7, wherein said step of (b) texturizing said exposed polysilicon surface comprises anisotropically etching said exposed polysilicon surface.

12. A process as recited in claim 11, wherein said step of (c) comsuming substantially all of said polysilicon layer comprises continuing said anisotropically etching of said exposed polysilicon surface.

* * * * *